(12) United States Patent
Lin et al.

(10) Patent No.: US 11,984,261 B2
(45) Date of Patent: May 14, 2024

(54) INTEGRATION SCHEME FOR BREAKDOWN VOLTAGE ENHANCEMENT OF A PIEZOELECTRIC METAL-INSULATOR-METAL DEVICE

(71) Applicant: Taiwan Semiconductor Manufacturing Company, Ltd., Hsin-Chu (TW)

(72) Inventors: Anderson Lin, Hsinchu (TW); Chun-Ren Cheng, Hsin-Chu (TW); Chi-Yuan Shih, Hsinchu (TW); Shih-Fen Huang, Jhubei (TW); Yi-Chuan Teng, Zhubei (TW); Yi Heng Tsai, Hsinchu (TW); You-Ru Lin, New Taipei (TW); Yen-Wen Chen, Hsinchu County (TW); Fu-Chun Huang, Zhubei (TW); Fan Hu, Taipei (TW); Ching-Hui Lin, Taichung (TW); Yan-Jie Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 57 days.

(21) Appl. No.: 17/411,416

(22) Filed: Aug. 25, 2021

(65) Prior Publication Data

US 2021/0383972 A1 Dec. 9, 2021

Related U.S. Application Data

(63) Continuation of application No. 16/417,797, filed on May 21, 2019, now Pat. No. 11,107,630.

(Continued)

(51) Int. Cl.
*H01G 4/012* (2006.01)
*H01G 4/12* (2006.01)
(Continued)

(52) U.S. Cl.
CPC ............... *H01G 4/012* (2013.01); *H01G 4/12* (2013.01); *H01G 4/228* (2013.01);
(Continued)

(58) Field of Classification Search
CPC ............... H01L 41/047; H01L 41/0805; H01L 41/1875; H01L 41/1876
See application file for complete search history.

(56) References Cited

U.S. PATENT DOCUMENTS

| 5,410,208 A | 4/1995 | Walters et al. |
| 2003/0048041 A1* | 3/2003 | Kita ..................... H10N 30/082 310/328 |

(Continued)

OTHER PUBLICATIONS

Non-Final Office Action dated Aug. 5, 2020 for U.S. Appl. No. 16/417,797.

(Continued)

*Primary Examiner* — John A Bodnar
(74) *Attorney, Agent, or Firm* — Eschweiler & Potashnik, LLC

(57) ABSTRACT

Various embodiments of the present disclosure are directed towards an integrated chip including a dielectric structure sandwiched between a first electrode and a bottom electrode. A passivation layer overlies the second electrode and the dielectric structure. The passivation layer comprises a horizontal surface vertically below a top surface of the passivation layer. The horizontal surface is disposed above a top surface of the dielectric structure.

20 Claims, 7 Drawing Sheets

Related U.S. Application Data

(60) Provisional application No. 62/736,734, filed on Sep. 26, 2018.

(51) Int. Cl.
| | | |
|---|---|---|
| *H01G 4/228* | (2006.01) | |
| *H01L 21/311* | (2006.01) | |
| *H01L 21/3213* | (2006.01) | |
| *H01L 41/047* | (2006.01) | |
| *H01L 41/083* | (2006.01) | |
| *H01L 41/113* | (2006.01) | |
| *H01L 49/02* | (2006.01) | |
| *H10N 30/30* | (2023.01) | |
| *H10N 30/50* | (2023.01) | |
| *H10N 30/87* | (2023.01) | |

(52) U.S. Cl.
CPC .. *H01L 21/31111* (2013.01); *H01L 21/32139* (2013.01); *H01L 28/60* (2013.01); *H10N 30/302* (2023.02); *H10N 30/501* (2023.02); *H10N 30/508* (2023.02); *H10N 30/872* (2023.02)

(56) References Cited

U.S. PATENT DOCUMENTS

| | | | |
|---|---|---|---|
| 2005/0146772 | A1 | 7/2005 | Murata et al. |
| 2014/0265726 | A1 | 9/2014 | Andosca |
| 2016/0090299 | A1* | 3/2016 | Sasagawa ........... B81C 1/00801 |
| | | | 438/653 |
| 2017/0033713 | A1* | 2/2017 | Petroni ................. H02N 2/185 |
| 2017/0199357 | A1* | 7/2017 | Craen ................. G02B 3/0081 |
| 2018/0062608 | A1* | 3/2018 | Lee ..................... H03H 9/02157 |

OTHER PUBLICATIONS

Final Office Action dated Feb. 12, 2021 for U.S. Appl. No. 16/417,797.
Notice of Allowance dated Apr. 30, 2021 for U.S. Appl. No. 16/417,797.

* cited by examiner

INTEGRATION SCHEME FOR BREAKDOWN VOLTAGE ENHANCEMENT OF A PIEZOELECTRIC METAL-INSULATOR-METAL DEVICE

REFERENCE TO RELATED APPLICATIONS

This Application is a Continuation of U.S. application Ser. No. 16/417,797, filed on May 21, 2019, which claims the benefit of U.S. Provisional Application No. 62/736,734, filed on Sep. 26, 2018. The contents of the above-referenced Patent Applications are hereby incorporated by reference in their entirety.

BACKGROUND

Piezoelectric devices (e.g., piezoelectric actuators, piezoelectric sensors, etc.) are used in many modern day electronic devices (e.g., automotive sensors/actuators, aerospace sensors/actuators, etc.). One example of a piezoelectric device is a piezoelectric actuator. A piezoelectric actuator can be utilized to create a physical movement that exerts a force on a physical part in a system under the control of an electrical signal. The physical movement generated by the piezoelectric actuator can be utilized to control various kinds of systems (e.g., mechanical systems, optical systems, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
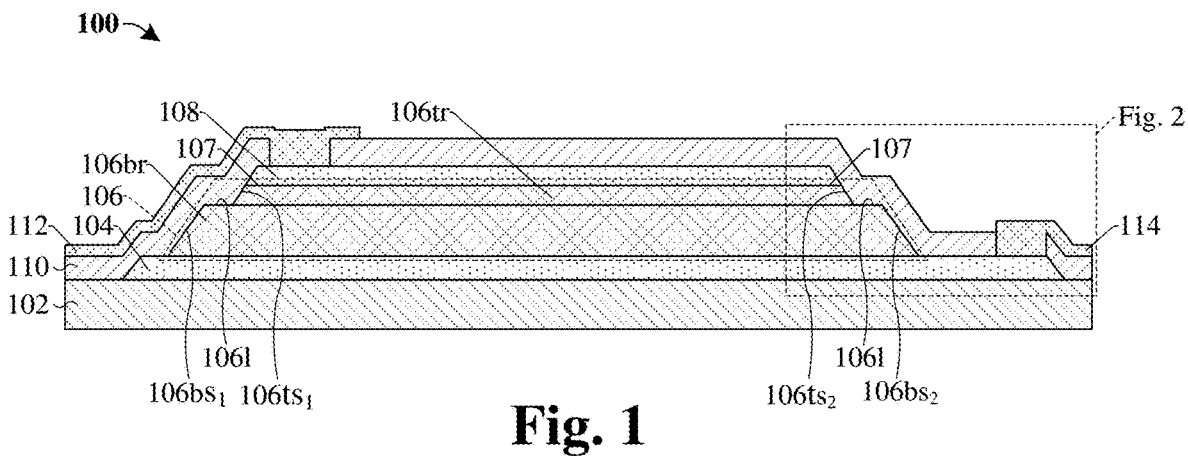
FIG. 1 illustrates a cross-sectional view of some embodiments of a metal-insulator-metal (MIM) capacitor having a piezoelectric structure comprising a ledge in contact with a passivation layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some piezoelectric devices include a piezoelectric structure between a top electrode and a bottom electrode referred to as a piezoelectric metal-insulator-metal (MIM) device. During formation of the piezoelectric MIM device, a piezoelectric layer is formed over a bottom metal layer and a top metal layer is formed over the piezoelectric layer. A patterning process is performed on the aforementioned layers to define the top electrode, the piezoelectric structure, and the bottom electrode of the piezoelectric MIM device. When a voltage is applied between the top electrode and the bottom electrode, an electrical field generated by the applied voltage can cause the piezoelectric structure to change from a first shape to a second shape. This change in shape can be used to control various kinds of systems (e.g., mechanical systems, optical systems, etc.).

A challenge with the above piezoelectric MIM device is premature device breakdown due to high physical strain. During operation of the piezoelectric MIM device a top edge of the top electrode in contact with the piezoelectric layer collects a high electrical field relative to the bottom electrode or middle area of the top electrode. The high electrical field at the top edge of the top electrode results in high physical strain at the top edge while the piezoelectric layer changes shape. This high physical strain causes the top edge to delaminate from the piezoelectric layer at a first bias voltage (e.g., a voltage of approximately 67 volts) resulting in a premature breakdown (e.g., breakdown may occur when the top electrode shorts to the bottom electrode) of the piezoelectric MIM device.

In some embodiments of the present disclosure, an improved method for manufacturing a piezoelectric MIM device that utilizes an over-etch process and formation of a passivation layer to mitigate premature device breakdown is provided. The improved method includes forming a piezoelectric layer over a bottom metal layer and forming a top metal layer over the piezoelectric layer. A first patterning process is performed on the top metal layer to define the top electrode. While performing the first patterning process an over-etch process is performed and a top region of the piezoelectric layer is patterned as well. A second patterning process is performed on a bottom region (directly underlying the top region) of the piezoelectric layer to define the piezoelectric structure. The second patterning process defines a ledge of the piezoelectric structure such that outer sidewalls of the top region of the piezoelectric structure are laterally offset from outer sidewalls of the bottom region of the piezoelectric structure. A top edge of the top electrode is in direct contact with a top edge of the top region of the piezoelectric structure. A third patterning process is performed on the bottom metal layer to define the bottom electrode. A passivation layer is formed over the top electrode, piezoelectric structure, and bottom electrode. The passivation layer is configured to clamp the top edge of the top electrode to the top region of the piezoelectric structure such that the improved process mitigates the effects of the high physical strain experienced at the top edge of the top electrode.

During operation of the piezoelectric MIM device the passivation layer acts as a clamp that prevents the top edge of the top electrode from delaminating from the piezoelectric structure, especially under stressed conditions (i.e., high electrical field, high temperatures, and adverse environmental conditions). The clamping effect is due to the formation of the ledge in the piezoelectric structure before forming the passivation layer, this causes the passivation layer to have a straight segment overlying an interface between the top edge and the passivation structure. This, in turn, prevents the premature breakdown of the piezoelectric MIM device and device breakdown may occur at a second bias voltage (e.g., a voltage of approximately 110 volts) greater than the first bias voltage. Further, the top edge of the top electrode may not delaminate before or during the device breakdown at the second bias voltage. Therefore, the over-etch and clamping effect from the passivation layer increases the voltage the piezoelectric MIM device can operate at before breakdown occurs, thus increasing device performance, reliability, and structural integrity.

Referring to FIG. 1, a cross-sectional view of a piezoelectric metal-insulator-metal (MIM) device 100 in accordance with some embodiments is provided.

The piezoelectric MIM device 100 includes a bottom electrode 104 overlying a substrate 102. A piezoelectric structure 106 is disposed between a top electrode 108 and the bottom electrode 104. A passivation layer 110 overlies the top electrode 108, the piezoelectric structure 106, and the bottom electrode 104. A first conductive contact 112 overlies the passivation layer 110 and directly contacts the top electrode 108 on a first side of the piezoelectric MIM device 100. A second conductive contact 114 overlies the passivation layer 110 and directly contacts the bottom electrode 104. The first and second conductive contacts 112, 114 are respectively electrically coupled to the top electrode 108 and the bottom electrode 104.

The piezoelectric structure 106 comprises a top region 106$tr$ directly overlying a bottom region 106$br$. The piezoelectric structure 106 is a single continuous material from a bottom surface of the bottom region 106$br$ to a top surface of the top region 106$tr$. In some embodiments, the top region 106$tr$ is a first piezoelectric material and the bottom region 106$br$ is a second piezoelectric material different than the first piezoelectric material (not shown). The bottom region 106$br$ comprises a first pair of opposing sidewalls 106$bs_1$, 106$bs_2$ and the top region 106$tr$ comprises a second pair of opposing sidewalls 106$ts_1$, 106$ts_2$. The second pair of opposing sidewalls 106$ts_1$, 106$ts_2$ of the top region 106$tr$ are laterally offset the first pair of opposing sidewalls 106$bs_1$, 106$bs_2$ of the bottom region 106$br$ by a ledge 106$l$ of the piezoelectric structure 106. The passivation layer 110 continuously extends from a top surface of the top electrode 108 across the second pair of opposing sidewalls 106$ts_1$, 106$ts_2$, the ledge 106$l$, and the first pair of opposing sidewalls 106$bs_1$, 106$bs_2$ to a top surface of the bottom electrode 104. The passivation layer 110 includes a segment that extends along a straight line from the ledge 106$l$ to the top surface of the top electrode 108 such that the passivation layer 110 acts as a clamp on an interface 107 between the top electrode 108 and the piezoelectric structure 106. This, in turn, increases the structural integrity of the top electrode 108 and the piezoelectric structure 106 at the interface 107.

During operation of the piezoelectric MIM device 100 a voltage is applied between the top electrode 108 and the bottom electrode 104. An electrical field generated by the applied voltage can cause the piezoelectric structure 106 to change from a first shape to a second shape (not shown). This change in shape may be used to control various kinds of systems (e.g., mechanical systems, optical systems, etc.). Further, the change in shape results in mechanical stress on the piezoelectric MIM device 100 especially as the applied voltage increases. As the applied voltage increases, for example, to a first bias voltage (e.g., a voltage within a range of approximately 67-109 volts) a high local electrical field will collect at a top edge of the top electrode 108 at the interface 107. The high local electrical field causes the top edge of the top electrode 108 to be susceptible to delamination. However, the shape of the passivation layer 110 over the top electrode 108 and the piezoelectric structure 106 is configured to clamp the top edge of the top electrode 108 to the piezoelectric structure 106 at the interface 107. This, in turn, prevents delamination of the top electrode 108 at the first bias voltage. Further, as the applied voltage reaches a break down bias voltage (e.g., approximately 110 volts or greater), the breakdown may not occur at the top edge of the top electrode 108, but instead at a different location. Therefore, the clamp effect of the passivation layer 110 at the interface 107 increases the structural integrity, voltage operation range, and reliability of the piezoelectric MIM device 100.

Figure 2:
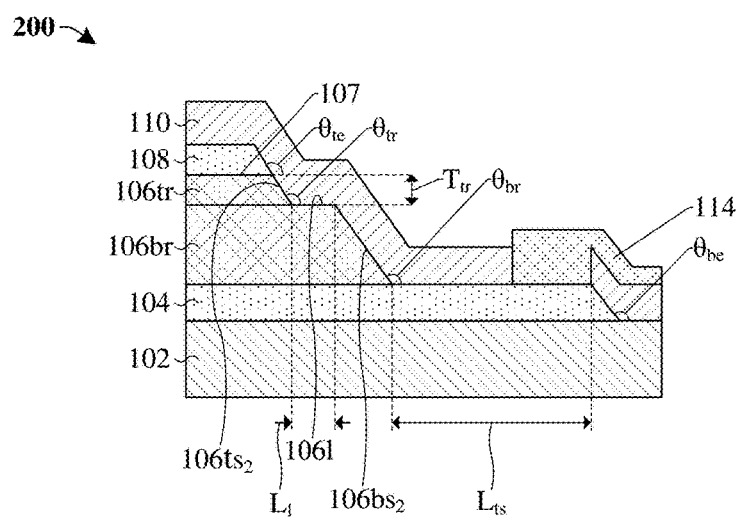
FIG. 2 illustrates a cross-sectional view of a close-up of a first side of the MIM capacitor of FIG. 1.

Referring to FIG. 2, some embodiments of a cross-sectional view 200 of a portion of the piezoelectric MIM device 100 of FIG. 1, as indicated by the dashed outline box shown in FIG. 1 is provided.

As seen in the cross-sectional view 200 a plurality of angles, lengths and thicknesses are labeled. Unless otherwise stated, an angle in the plurality of angles is defined relative to a flat horizontal line. A sidewall of the top electrode 108 is angled at a non-zero top electrode sidewall angle $\theta_{te}$ relative to a flat horizontal line extending across a bottom surface of the top electrode 108. A first outer sidewall 106$ts_2$ of the top region 106$tr$ is angled at a non-zero top region sidewall angle $\theta_{tr}$ relative to a ledge 106$l$. In some embodiments, the top electrode sidewall angle $\theta_{te}$ and the top region sidewall angle $\theta_{tr}$ are equal. In some embodiments, the top electrode sidewall angle $\theta_{te}$ and the top region sidewall angle $\theta_{tr}$ may, for example, be within a range of approximately 90 to 170 degrees. A first outer sidewall 106$bs_2$ of the bottom region 106$br$ is angled at a non-zero bottom region sidewall angle $\theta_{br}$ relative to a top surface of the bottom electrode 104. In some embodiments, the bottom region sidewall angle $\theta_b$r may, for example, be within a range of approximately 90 to 170 degrees. A sidewall of the bottom electrode 104 is angled at a non-zero bottom electrode sidewall angle $\theta_{be}$ relative to a top surface of the substrate 102. In some embodiments, the bottom electrode sidewall angle $\theta_b$e may, for example, be within a range of approximately 90 to 170 degrees. While the respective opposing sidewall of each sidewall referenced above is not shown in cross-sectional view 200, it may be appreciated that the respective opposing sidewall illustrated in FIG. 1 of each sidewall referenced above has the same sidewall angle. For example, a second outer sidewall (106$ts_1$ of FIG. 1) of the top region 106*tr* is angled at the non-zero top region sidewall angle $\theta_{tr}$ relative to the ledge 106*l*.

In some embodiments, a thickness $T_{tr}$ of the top region is within a range of approximately 1 to 4 Angstroms, 10 to 400 Angstroms, 0.1 to 0.4 micrometers, 1 to 40 micrometers, or 100 to 400 micrometers. In some embodiments, the thickness $T_{tr}$ of the top region 106*tr* is at least half as thick as the bottom region 106*br*. In some embodiments, a thickness of the bottom region 106*br* is within a range of 2 to 10 times greater than the thickness $T_{tr}$ of the top region 106*tr*. In some embodiments, if the thickness of the bottom region 106*br* is, for example, greater than 10 times thicker than the thickness $T_{tr}$ of the top region 106*tr*, the passivation layer 110 may be unable to effectively clamp the top electrode 108 to the top region 106*tr* and delamination at the interface 107 may occur. In some embodiments, a length $L_1$ of the ledge 106*l* is within a range of approximately 5 to 100 Angstroms, 50 to 1000 Angstroms, 0.05 to 1 micrometers, 0.5 to 100 micrometers, or 50 to 1000 micrometers. In some embodiments, a length $L_{ts}$ of a segment of a top surface of the bottom electrode 104 between a lower bottom edge of the bottom region 106*tr* and a top edge of the bottom electrode 104 is within a range of approximately 10 to 100 Angstroms, 100 to 1000 Angstroms, 0.1 to 1 micrometers, 1 to 100 micrometers, or 100 to 1000 micrometers. In some embodiments, the length $L_{ts}$ of the segment of the top surface of the bottom electrode 104 is within a range of 0.5 to 10 times greater than the length $L_1$ of the ledge 106*l*. In some embodiments, if the length $L_1$ of the ledge 106*l* is, for example, too small (e.g., less than 5 Angstroms) then the passivation layer 110 may not have a proper shape over the interface 107.

Figure 3:
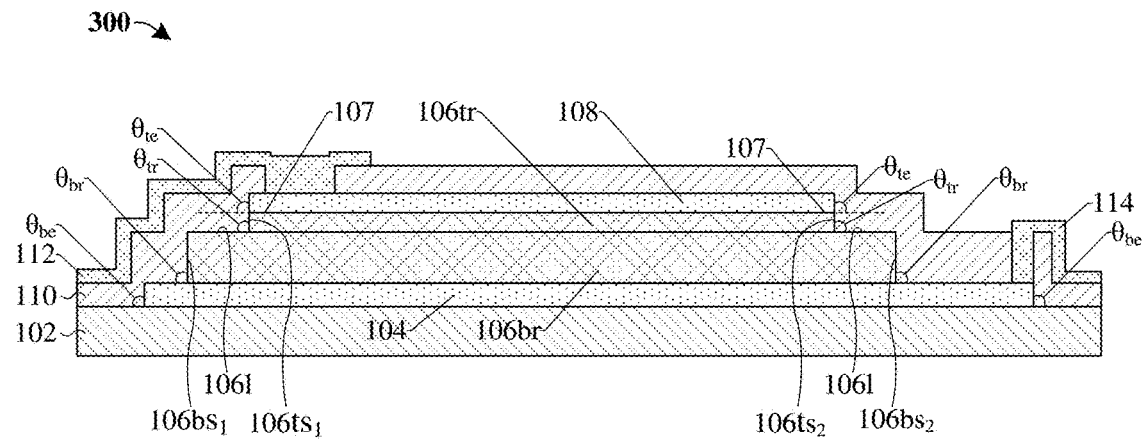
FIG. 3 illustrates a cross-sectional view of some alternative embodiments of the MIM capacitor of FIG. 1.

With reference to FIG. 3, a cross-sectional view of a piezoelectric MIM device 300 according to some alternative embodiments of the piezoelectric MIM device 100 of FIG. 1 is provided in which outer sidewalls of the top electrode 108, top region 106*tr*, bottom region 106*br*, and bottom electrode 104 are respectively vertical.

Outer sidewalls of the top electrode 108 are respectively angled by a top electrode sidewall angle $\theta_{te}$ (e.g., 90 degrees) relative to a flat horizontal line extending across a bottom surface of the top electrode 108. The top region 106*tr* comprises the second pair of opposing sidewalls 106*ts$_1$*, 106*ts$_2$* respectively angled by a top region sidewall angle $\theta_{tr}$ (e.g., 90 degrees) relative to the ledge 106*l*. The bottom region 106*br* comprises the first pair of opposing sidewalls 106*bs$_1$*, 106*bs$_2$* respectively angled by a bottom region sidewall angle $\theta_{br}$ (e.g., 90 degrees) relative to a top surface of the bottom electrode 104. Outer sidewalls of the bottom electrode 104 are respectively angled by a bottom electrode sidewall angle $\theta_{be}$ (e.g., 90 degrees) relative to a top surface of the substrate 102. Therefore, the aforementioned sidewalls outlined above are angled at a same angle value (i.e., 90 degrees). In some embodiments, the aforementioned sidewalls outlined above are angled at the same angle value such as, for example, 100 degrees, 135 degrees, or a value within a range of approximately 90 to 170 degrees.

Figure 4:
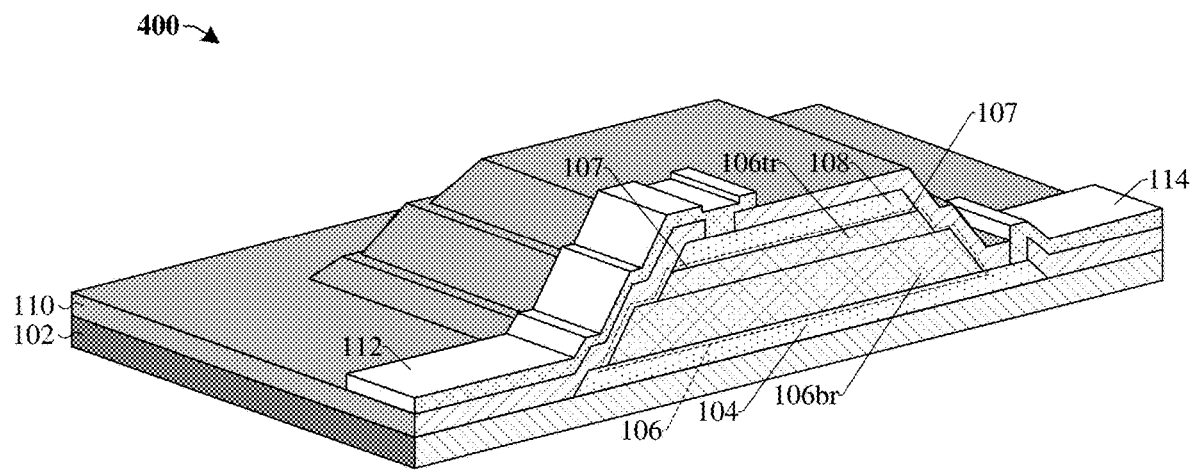
FIG. 4 illustrates a perspective view of some embodiments of a MIM capacitor having a piezoelectric structure comprising a ledge in contact with a passivation layer.

With reference to FIG. 4, a perspective view of a piezoelectric MIM device 400 according to some alternative embodiments of the piezoelectric MIM device 100 of FIG. 1 is provided.

The piezoelectric MIM device 400 includes a substrate 102 below a bottom electrode 104. A piezoelectric structure 106 overlies the bottom electrode 104. The piezoelectric structure 106 comprises a top region 106*tr* directly overlying a bottom region 106*br*. A top electrode 108 overlies the piezoelectric structure 106 such that outer sidewalls of the top electrode 108 are aligned with outer sidewalls of the top region 106*tr*. A passivation layer 110 overlies the top electrode 108, the piezoelectric structure 106, the bottom electrode 104, and the substrate 102. A first conductive contact 112 overlies the passivation layer 110 and directly contacts the top electrode 108. A second conductive contact 114 overlies the passivation layer 110 and directly contacts the bottom electrode 104. The first and second conductive contacts 112, 114 are respectively electrically coupled to the top electrode 108 and the bottom electrode 104. During operation of the piezoelectric MIM device 400 a bias voltage is applied between the first and second conductive contacts 112, 114.

The passivation layer 110 is configured to clamp the top electrode 108 to the top region 106*tr* of the piezoelectric structure 106 at an interface 107. The passivation layer 110 directly contacts outer sidewalls of the top electrode 108, outer sidewalls of the top region 106*tr*, outer sidewalls of the bottom region 106*br*, and outer sidewalls of the bottom electrode 104. The passivation layer extends continuously from a top surface of the top electrode 108 to a top surface of the substrate 102.

Figure 5:
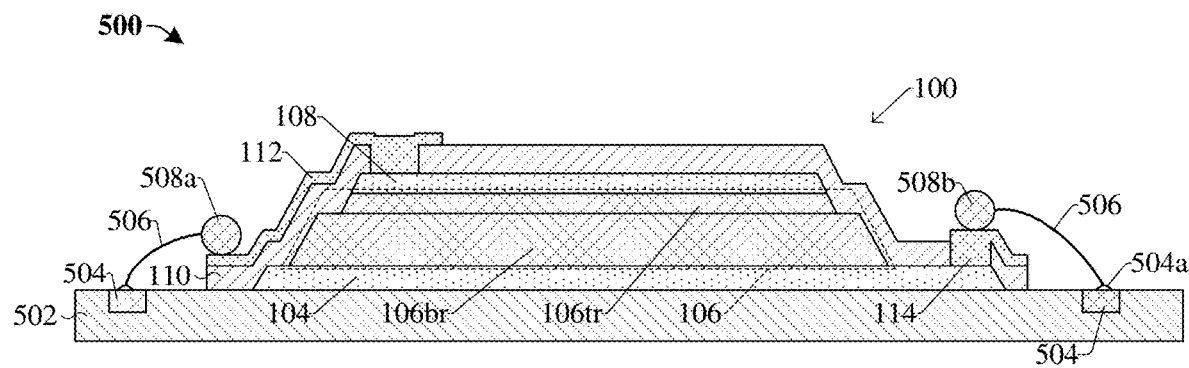
FIG. 5 illustrates a cross-sectional view of some alternative embodiments of the MIM capacitor of FIG. 1.

With reference to FIG. 5, a cross-sectional view of some embodiments of an integrated chip 500 including the piezoelectric MIM device 100 of FIG. 1 is provided in which the first and second conductive contacts 112, 114 are respectively wired bonded to metal lines 504 disposed within a printed circuit board (PCB) substrate 502.

The integrated chip 500 includes the piezoelectric MIM device 100 overlying the PCB substrate 502. A bottom electrode 104 overlies the PCB substrate 502. A piezoelectric structure 106 overlies the bottom electrode 104. The piezoelectric structure 106 comprises a top region 106*tr* directly overlying a bottom region 106*br*. A maximum width of the top region 106*tr* is less than a minimum width of the bottom region 106*br*. A top electrode 108 overlies the piezoelectric structure 106 such that outer sidewalls of the top electrode 108 are aligned with outer sidewalls of the top region 106*tr*. A passivation layer 110 overlies the top electrode 108, the piezoelectric structure 106, the bottom electrode 104, and the substrate 102. A first conductive contact 112 overlies the passivation layer 110 and directly contacts the top electrode 108 on a first side of the piezoelectric MIM device 100. A second conductive contact 114 overlies the passivation layer 110 and directly contacts the bottom electrode 104. The first and second conductive contacts 112, 114 are respectively electrically coupled to the top electrode 108 and the bottom electrode 104.

The PCB substrate 502 comprises the metal lines 504. Electrical connector pads 504*a* respectively overlie the metal lines 504. A first solder ball 508*a* overlies the first conductive contact 112. A second solder ball 508*b* overlies the second conductive contact 114. The first and second solder balls 508*a*, 508*b* provide contacts points for conductive wires 506. The conductive wires 506 directly contact the metal lines 504 and the connector pads 504*a*. In some embodiments, the conductive wires 506 are electrically coupled to a different independent device (not shown). In some embodiments, the metal lines 504 are electrically coupled to electronic devices (e.g., transistors, resistors, capacitors, varactors, etc.) through a back end of line (BEOL) interconnect structure underlying the metal lines 504 (not shown).

In some embodiments, the passivation layer 110 may, for example, be or comprise ceramic, metal oxide, carbide, silicon oxide, nitride, or the like formed to a thickness within a range of approximately 1000 to 3000 Angstroms. In some embodiments, if the passivation layer 110 is formed to a thickness less than approximately 1000 Angstroms, the piezoelectric MIM device 100 may have insufficient structural integrity. This, in turn, may result in premature breakdown at a bias voltage (e.g., 67 volts) less than approximately 110 volts. In some embodiments, if the passivation layer 110 is formed to a thickness greater than approximately 3000 Angstroms, the piezoelectric MIM device 100 may have increased structural integrity but device performance will be degraded (e.g., when the piezoelectric MIM device 100 is configured as an actuator). This, in turn, may mitigate the change in shape the piezoelectric structure 106 may undergo.

In some embodiments, the top electrode 108 and the bottom electrode 104 may, for example, be or comprise stainless steel, brass, copper, galvanized iron, lead, monel, nickel, nickel-chromium, zinc, bronze, aluminum, platinum, gold, ruthenium, graphite, calcium, lithium fluoride, molybdenum(VI) oxide, silver, palladium, Tin, scandium, titanium, vanadium, chromium, manganese, cobalt, gallium, indium, thallium, doped silicon, polysilicon, germanium, antimony, tungsten, hafnium, iridium, mixed metal oxide, titanium nitride, tantalum nitride, or the like. In some embodiments, the top electrode 108 and/or the bottom electrode 104 may, for example, be formed to a thickness within a range of approximately 10 to 100 Angstroms, 100 to 1000 Angstroms, 0.1 to 1 micrometers, 1 to 100 micrometers, or 100 to 1000 micrometers. In some embodiments, the piezoelectric structure 106 may, for example, be or comprise a piezoelectric material, aluminum nitride, lead zirconate titanate (e.g., $Pb[Zr_xTi_{1-x}]O_3$, where x is a suitable positive number), zinc oxide, or the like formed to a thickness within a range of approximately 10 to 100 Angstroms, 100 to 1000 Angstroms, 0.1 to 1 micrometers, 1 to 100 micrometers, or 100 to 1000 micrometers.

FIGS. 6-14 illustrate cross-sectional views 600-1400 of some embodiments of a method of forming a piezoelectric metal-insulator-metal (MIM) device according to the present disclosure. Although the cross-sectional views 600-1400 shown in FIGS. 6-14 are described with reference to a method, it will be appreciated that the structures shown in FIGS. 6-14 are not limited to the method but rather may stand alone separate of the method. Although FIGS. 6-14 are described as a series of acts, it will be appreciated that these acts are not limiting in that the order of the acts can be altered in other embodiments, and the methods disclosed are also applicable to other structures.

Figure 6:
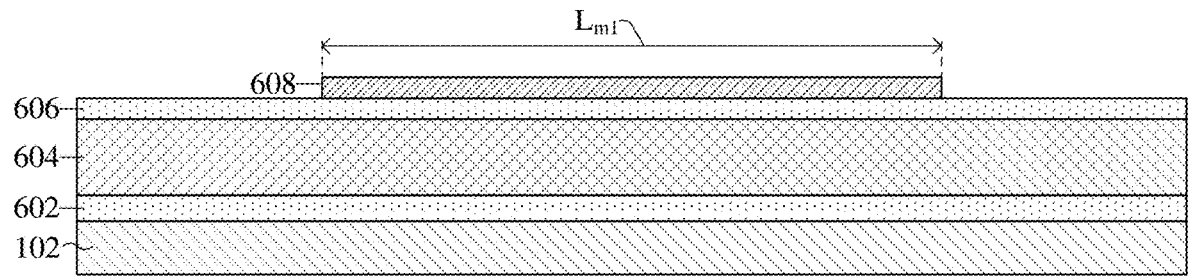
FIGS. 6-14 illustrate cross-sectional views of some embodiments of forming a MIM capacitor having a piezoelectric structure comprising a ledge in contact with a passivation layer.

As shown in cross-sectional view 600 of FIG. 6, a substrate 102 is provided. A bottom metal layer 602 is formed over the substrate 102. A piezoelectric layer 604 is formed over the bottom metal layer 602. A top metal layer 606 is formed over the piezoelectric layer 604. A first masking layer 608 is formed over the top metal layer 606. The first masking layer 608 has a length $L_{m1}$ defined between outer sidewalls of the first masking layer 608.

Figure 7:
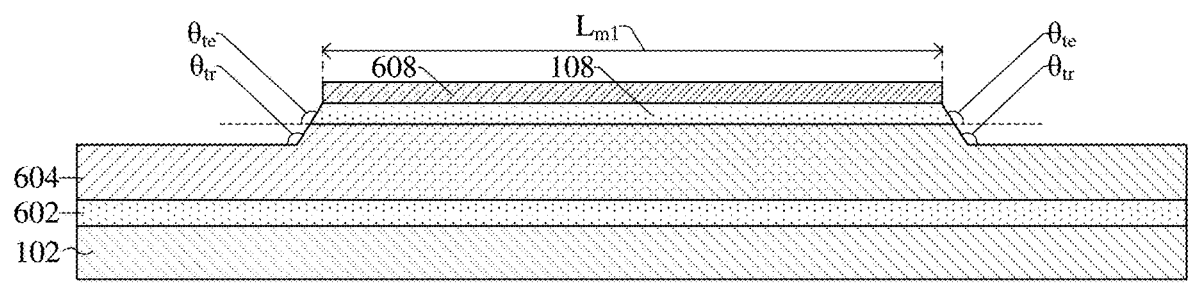

As shown in cross-sectional view 700 of FIG. 7, a first patterning process is performed on the structure of FIG. 6 according to the first masking layer 608. In some embodiments, the first patterning process removes an entire thickness of the top metal layer (606 of FIG. 6) laterally offset outer sidewalls of the first masking layer 608, thereby defining a top electrode 108. An etching process is used to define the top electrode 108 and over-etches into the piezoelectric layer 604 to define a top region of the piezoelectric layer 604. In some embodiments, the top metal layer (606 of FIG. 6) and the top region of the piezoelectric layer 604 are etched by a single etchant in a single etching process. Outer sidewalls of the top electrode 108 are aligned with outer sidewalls of the top region. The outer sidewalls of the top electrode 108 are respectively angled by a top electrode sidewall angle $\theta_{te}$ relative to a flat horizontal line extending across a bottom surface of the top electrode 108. The outer sidewalls of the top region are respectively angled by a top region sidewall angle $\theta_{tr}$ relative to a straight horizontal line aligned with a bottom surface of the top region. In some embodiments, the first patterning process includes a low selectivity dry etch, but other etch processes are amendable. A removal process is performed to remove the first masking layer 608 (not shown).

In further embodiments, the first patterning process includes performing a dry etch process (e.g., an ion-beam etch process). In such embodiments, the dry etch process may be performed at a non-zero angle relative to a substantially vertical line that is perpendicular to a top surface of the substrate 102. In such embodiments, the angle of the dry etch process may be set to define the top electrode sidewall angle $\theta_{te}$ and/or the top region sidewall angle $\theta_{tr}$. Additionally, the dry etch process is performed in such a manner that outer sidewalls of the top electrode 108 and sidewalls of the piezoelectric layer 604 are substantially aligned. This may be due to the low selectivity dry etch and/or the angle the dry etch process is performed at. In yet further embodiments, the first patterning process may form an undercut profile in the top electrode 108, wherein outer sidewalls of the top electrode 108 are spaced laterally between outer sidewalls of the first masking layer 608.

Figure 8:
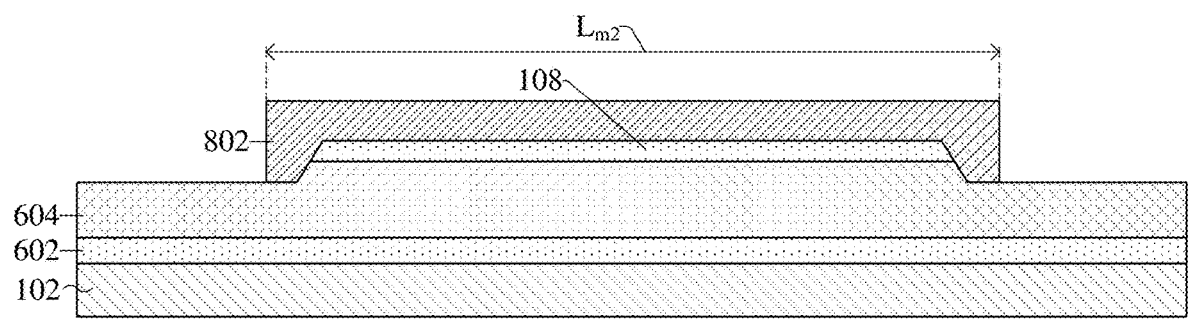

As shown in cross-sectional view 800 of FIG. 8, a second masking layer 802 is formed over the top electrode 108 and the piezoelectric layer 604. The second masking layer 802 has a length $L_{m2}$ defined between outer sidewalls of the second masking layer 802. In some embodiments, the length $L_{m1}$ of the first masking layer (608 of FIG. 6) is less than the length $L_{m2}$ of the second masking layer 802. In some embodiments, the second masking layer 802 is configured to protect the outer sidewalls of the top electrode 108 and sidewalls of the piezoelectric layer 604 during subsequent processing steps (e.g., the second patterning process of FIG. 9). Further, the second masking layer 802 is configured to define and/or protect the ledge (106l of FIG. 9) of the piezoelectric structure (106 of FIG. 9).

Figure 9:
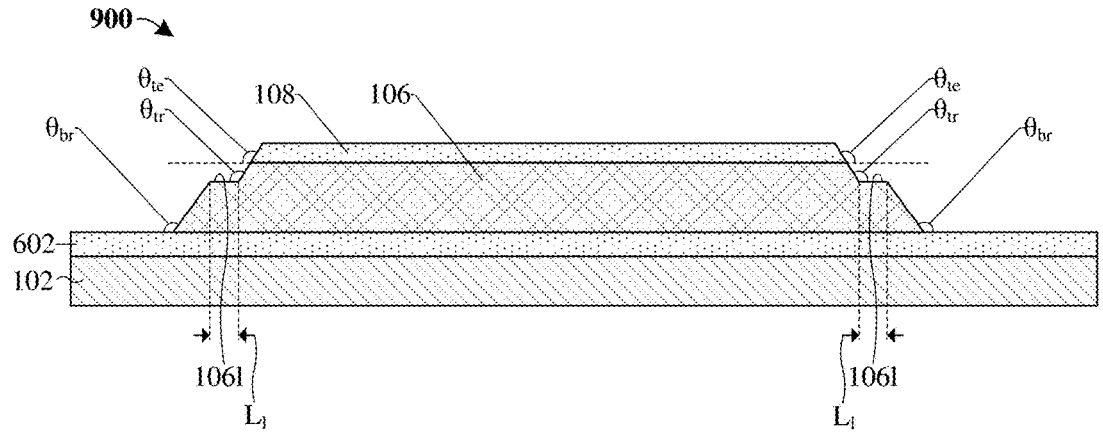

As shown in cross-sectional view 900 of FIG. 9, a second patterning process is performed on the structure of FIG. 8 according to the second masking layer (802 of FIG. 8). The second patterning process removes an entire thickness of the piezoelectric layer (604 of FIG. 8) laterally offset outer sidewall of the second masking layer (802 of FIG. 8) defining a piezoelectric structure 106. The second patterning process defines a bottom region of the piezoelectric structure 106 directly underlying the top region of the piezoelectric structure 106 and a ledge 106l of the piezoelectric layer 106. Outer sidewalls of the top region are laterally offset outer sidewalls of the bottom region by the ledge 106l. In some embodiments, a length $L_1$ of the ledge 106l is within a range of approximately 5 to 100 Angstroms, 50 to 1000 Angstroms, 0.05 to 1 micrometers, 0.5 to 100 micrometers, or 50 to 1000 micrometers. The outer sidewalls of the bottom region of the piezoelectric structure 106 are respectively angled by a bottom region sidewall angle $\theta_{br}$ relative to a top surface of the bottom metal layer 602. In some embodiments, the second patterning process includes a low selectivity dry etch, but other etch processes are amendable. The top region sidewall angle $\theta_{tr}$, ledge 106l, and bottom region angle $\theta_{br}$ help to clamp the top electrode 108 to the piezoelectric structure 106 and the bottom metal layer 602, so as to help limit delamination.

Figure 10:
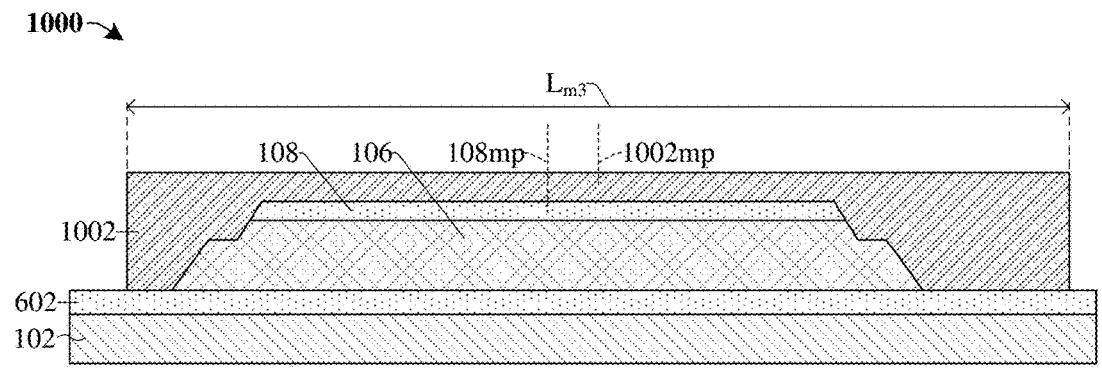

As shown in cross-sectional view 1000 of FIG. 10, a third masking layer 1002 is formed over the top electrode 108, the piezoelectric structure 106, and the bottom metal layer 602. A midpoint 1002mp of the third masking layer 1002 is laterally offset a midpoint 108mp of the top electrode 108 and the piezoelectric structure 106. In some embodiments, the midpoint 1002mp of the third masking layer 1002 is vertically aligned with the midpoint 108mp of the top electrode 108 and a midpoint of the piezoelectric structure 106 (not shown). The third masking layer 1002 has a length $L_{m3}$ defined between outer sidewalls of the third masking layer 1002. In some embodiments, the second length $L_{m2}$ of the second masking layer (802 of FIG. 8) is less than the length $L_{m3}$ of the third masking layer 1002. In such embodiments, the length $L_{m3}$ is greater than the length $L_{m1}$ of the first masking layer (608 of FIG. 6). In some embodiments, a size of the third masking layer 1002 is greater than a size of the second masking layer (802 of FIG. 8), and the size of the second masking layer (802 of FIG. 8) is greater than a size of the first masking layer (608 of FIG. 6). In further embodiments, a height of the third masking layer 1002 is greater than a height of the second masking layer (802 of FIG. 8), and the height of the second masking layer (802 of FIG. 8) is greater than a height of the first masking layer (608 of FIG. 6). The third masking layer 1002 is configured to protect the outer sidewalls of the top electrode 108, sidewalls of the piezoelectric structure 106, and/or the ledge (106l of FIG. 9) of the piezoelectric structure 106 from subsequent processing steps (e.g., the third patterning process of FIG. 11).

Figure 11:
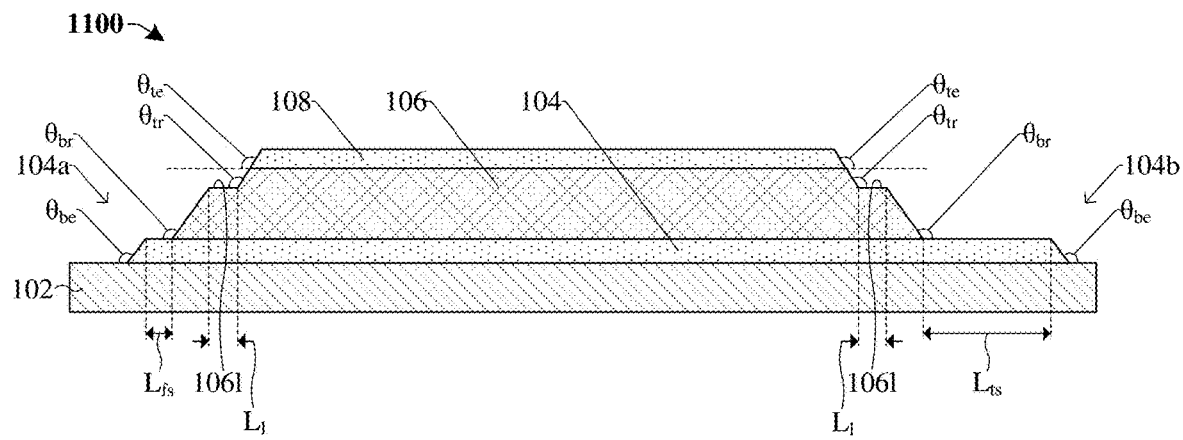

As shown in cross-sectional view 1100 of FIG. 11, a third patterning process is performed on the structure of FIG. 10 according to the third masking layer (1002 of FIG. 10). The third pattering process removes an entire thickness of the bottom metal layer (602 of FIG. 10) laterally offset outer sidewalls of the third masking layer (1002 of FIG. 10) defining a bottom electrode 104. In some embodiments, a length $L_{fs}$ of a segment of the bottom electrode 104 on a first side 104a between a first outer sidewall of the bottom region of the piezoelectric structure 106 and a first top edge of the bottom electrode 104 is within a range of approximately 1 to 25 Angstroms, 1 to 250 Angstroms, 0.01 to 0.25 micrometers, 0.1 to 25 micrometers, or 10 to 250 micrometers. In some embodiments, a length $L_{ts}$ of a segment of the bottom electrode 104 on a second side 104b between a second outer sidewall of the bottom region of the piezoelectric structure 106 and a second top edge of the bottom electrode 104 is within a range of approximately 10 to 100 Angstroms, 100 to 1000 Angstroms, 0.1 to 1 micrometers, 1 to 100 micrometers, or 100 to 1000 micrometers. In some embodiments, the length $L_{ts}$ of the segment of the bottom electrode 104 on the second side 104b is within a range of 2 to 10 times greater than the length $L_{fs}$ of the segment of the bottom electrode 104 on the first side 104a. Outer sidewalls of the bottom electrode 104 are respectively angled by a bottom electrode sidewall angle $\theta_{be}$ relative to a top surface of the substrate 102.

Figure 12:
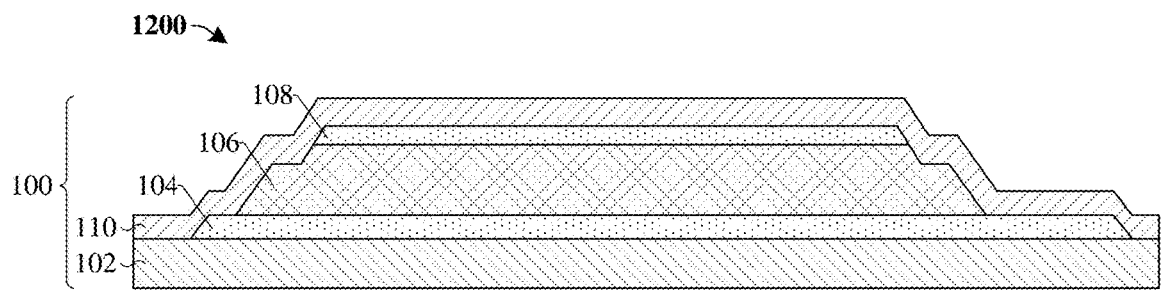

As shown in cross-sectional view 1200 of FIG. 12, a passivation layer 110 is formed over the top electrode 108, the piezoelectric structure 106, the bottom electrode 104, and the substrate 102 define a piezoelectric MIM device 100. In some embodiments, the passivation layer 110 may, for example, be or comprise ceramic, metal oxide, carbide, silicon oxide, nitride, or the like formed to a thickness within a range of approximately 1000 to 3000 Angstroms. In some embodiments, if the passivation layer 110 is formed to a thickness less than approximately 1000 Angstroms, the piezoelectric MIM device 100 may exhibit premature breakdown at a bias voltage (e.g., 67 volts) less than approximately 110 volts during operation of the piezoelectric MIM device 100. In some embodiments, if the passivation layer 110 is formed to a thickness greater than approximately 3000 Angstroms, the piezoelectric MIM device 100 may have increased structural integrity but device performance will be degraded (e.g., when the piezoelectric MIM device 100 is configured as an actuator). This, in turn, may mitigate the change in shape the piezoelectric structure 106 may undergo.

Figure 13:
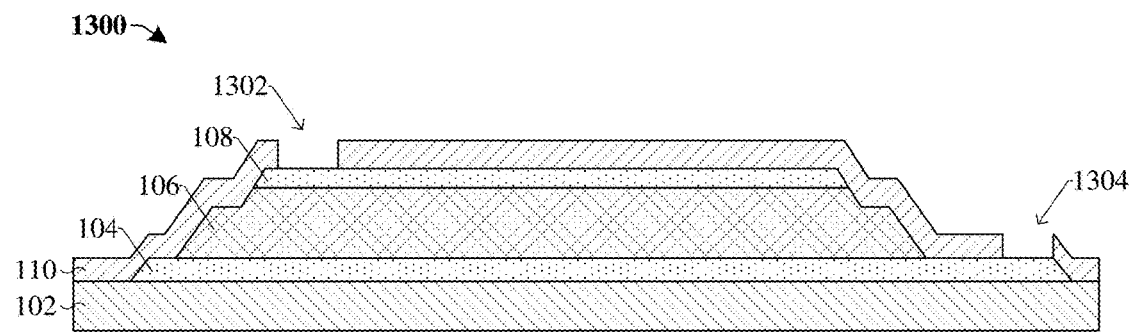

As shown in cross-sectional view 1300 of FIG. 13, the passivation layer 110 is patterned forming a first opening 1302 above a top surface of the top electrode 108 and forming a second opening 1304 above a top surface of the bottom electrode 104.

Figure 14:
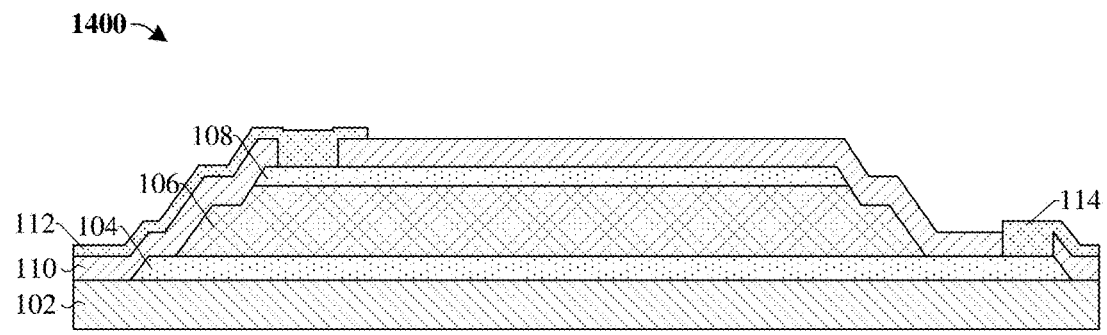

As shown in cross-sectional view 1400 of FIG. 14, a first conductive contact 112 is formed over the passivation layer 110 and the top electrode 108. The first conductive contact 112 directly contacts the top surface of the top electrode 108 and fills the first opening (1302 of FIG. 13). A second conductive contact 114 is formed over the passivation layer 110 and the bottom electrode 104. The second conductive contact 114 directly contacts the top surface of the bottom electrode 104 and fills the second opening (1304 of FIG. 13). In some embodiments, the first and second conductive contacts 112, 114 may, for example, be or comprise copper, aluminum, or the like. In some embodiments the first and second conductive contacts 112, 114 are comprised of a conductive material different than a material of the top electrode 108 and/or the bottom electrode 104.

Figure 15:
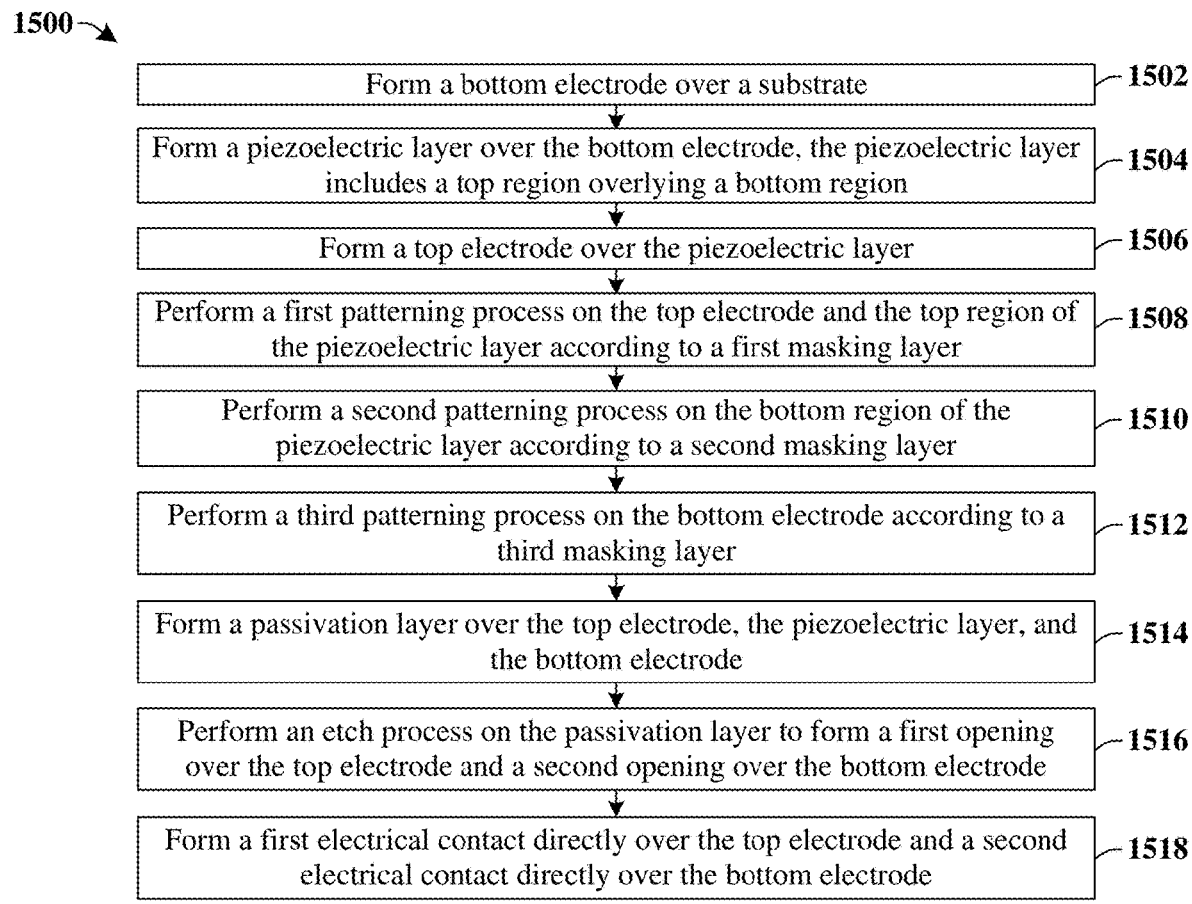
FIG. 15 illustrates a methodology in flowchart format that illustrates some embodiments of forming a MIM capacitor having a piezoelectric structure comprising a ledge in contact with a passivation layer.

FIG. 15 illustrates a method 1500 of forming a piezoelectric metal-insulator-metal (MIM) device in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, a bottom electrode is formed over a substrate. FIG. 6 illustrates a cross-sectional view 600 corresponding to some embodiments of act 1502.

At 1504, a piezoelectric layer is formed over the bottom electrode, the piezoelectric layer includes a top region overlying a bottom region. FIG. 6 illustrates a cross-sectional view 600 corresponding to some embodiments of act 1504.

At 1506, a top electrode is formed over the piezoelectric layer. FIG. 6 illustrates a cross-sectional view 600 corresponding to some embodiments of act 1506.

At 1508, a first patterning process is performed on the top electrode and the top region of the piezoelectric layer according to a first masking layer. FIGS. 6 and 7 illustrate cross-sectional views 600 and 700 corresponding to some embodiments of act 1508.

At 1510, a second patterning process is performed on the bottom region of the piezoelectric layer according to a second masking layer. FIGS. 8 and 9 illustrate cross-sectional views 800 and 900 corresponding to some embodiments of act 1510.

At 1512, a third patterning process is performed on the bottom electrode according to a third masking layer. FIGS. 10 and 11 illustrate cross-sectional views 1000 and 1100 corresponding to some embodiments of act 1512.

At 1514, a passivation layer is formed over the top electrode, the piezoelectric layer, and the bottom electrode. FIG. 12 illustrates a cross-sectional view 1200 corresponding to some embodiments of act 1514.

At 1516, an etch process is performed on the passivation layer to form a first opening over the top electrode and a second opening over the bottom electrode. FIG. 13 illustrates a cross-sectional view 1300 corresponding to some embodiments of act 1516.

At 1518, a first electrical contact is formed directly over the top electrode and a second electrical contact is formed directly over the bottom electrode. FIG. 14 illustrates a cross-sectional view 1400 corresponding to some embodiments of act 1518.

Accordingly, in some embodiments, the present disclosure relates to a method of forming a piezoelectric MIM device that includes a passivation layer configured to clamp a top electrode to a piezoelectric structure.

In some embodiments, the present application provides a piezoelectric device including: a bottom electrode; a top electrode overlying the bottom electrode; and a piezoelectric layer disposed between the bottom electrode and the top electrode, wherein the piezoelectric layer comprises a top region overlying a bottom region, outer sidewalls of the bottom region extend past outer sidewalls of the top region, wherein the outer sidewalls of the top region are aligned with outer sidewalls of the top electrode.

In some embodiments, the present application provides a metal-insulator-metal (MIM) device, including: a semiconductor substrate; a bottom electrode overlying the semiconductor substrate; a top electrode overlying the bottom electrode; a passivation layer overlying the top electrode; and a piezoelectric structure between the top electrode and the bottom electrode, wherein the piezoelectric structure comprises a first outer sidewall facing a first direction and a second outer sidewall facing the first direction, wherein the first outer sidewall is laterally offset the second outer sidewall by a ledge of the piezoelectric structure extending from the first outer sidewall to the second outer sidewall, and wherein the ledge of the piezoelectric structure is in direct contact with the passivation layer.

In some embodiments, the present application provides a method for forming a metal-insulator-metal (MIM) structure, the method including: forming a bottom electrode over a substrate; forming a piezoelectric layer over the bottom electrode, wherein the piezoelectric layer comprises a top region overlying a bottom region; forming a top electrode over the piezoelectric layer; performing a first patterning process on the top electrode and the top region of the piezoelectric layer according to a first masking layer; performing a second patterning process on the bottom region of the piezoelectric layer according to a second masking layer, wherein a size of the second masking layer is greater than a size of the first masking layer; performing a third patterning process on the bottom electrode according to a third masking layer, wherein a size of the third masking layer is greater than the size of the second masking layer; and forming a passivation layer over the top electrode, piezoelectric layer, and the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a first electrode;
   a second electrode over the first electrode;
   a dielectric structure sandwiched between the first electrode and the second electrode; and
   a passivation layer over the second electrode and the dielectric structure, wherein the passivation layer comprises a first horizontal surface and a second horizontal surface vertically below a top surface of the passivation layer, wherein the first and second horizontal surfaces are disposed above a top surface of the dielectric structure and below a top surface of the second electrode, wherein outermost opposing sidewalls of the second electrode are spaced laterally between the first and second horizontal surfaces.

2. The integrated chip of claim 1, wherein the first and second horizontal surfaces directly overlie outer edges of the dielectric structure, wherein the outer edges of the dielectric structure directly overlie a top surface of the first electrode.

3. The integrated chip of claim 1, wherein a thickness of the passivation layer between the first horizontal surface and a ledge of the dielectric structure is greater than a thickness of the second electrode.

4. The integrated chip of claim 1, further comprising:
   a conductive contact overlying the passivation layer, wherein the conductive contact has a slanted segment over the first horizontal surface.

5. The integrated chip of claim 4, wherein an outer sidewall of the conductive contact is aligned with an outer sidewall of the passivation layer.

6. The integrated chip of claim 4, wherein the dielectric structure comprises a ledge vertically below the top surface of the dielectric structure, wherein the slanted segment of the conductive contact directly overlies the ledge.

7. The integrated chip of claim 6, wherein the dielectric structure comprises a slanted sidewall over the ledge, wherein the slanted segment of the conductive contact directly overlies and is parallel to the slanted sidewall of the dielectric structure.

8. The integrated chip of claim 1, wherein the dielectric structure comprises lead zirconate titanate and the passivation layer comprises a ceramic.

9. An integrated chip comprising:
   a bottom electrode over a substrate;
   a top electrode over the bottom electrode;
   a piezoelectric structure disposed between the bottom electrode and the top electrode, wherein the piezoelectric structure comprises an upper piezoelectric region over a lower piezoelectric region, wherein a width of the upper piezoelectric region is less than a width of the lower piezoelectric region, wherein the upper piezoelectric region meets the top electrode at a first height over the substrate; and a dielectric layer over the piezoelectric structure and the top electrode, wherein the dielectric layer comprises a top surface having a second height over the substrate and a pair of upper surfaces having a third height over the substrate, wherein an outer perimeter of the upper piezoelectric region is spaced between the pair of upper surfaces, wherein the third height is greater than the first height and less than the second height.

10. The integrated chip of claim 9, wherein the lower piezoelectric region comprises an upper surface vertically below a top surface of the piezoelectric structure, wherein an outer sidewall of the dielectric layer directly overlies the upper surface of the lower piezoelectric region.

11. The integrated chip of claim 10, wherein the upper piezoelectric region comprises a first sidewall aligned with a sidewall of the top electrode and the lower piezoelectric region comprises a second sidewall laterally offset from the first sidewall in a direction away from the sidewall of the top electrode, wherein the upper surface of the lower piezoelectric region continuously extends from the first sidewall to the second sidewall, wherein a distance between the first sidewall and the outer sidewall of the dielectric layer is less than a distance between the second sidewall and the outer sidewall of the dielectric layer.

12. The integrated chip of claim 9, wherein a first thickness of the lower piezoelectric region is greater than a second thickness of the upper piezoelectric region, wherein the lower and upper piezoelectric regions both overlie a topmost surface of the bottom electrode.

13. The integrated chip of claim 12, wherein the piezoelectric structure is a single material continuously vertically extending from a top surface of the bottom electrode to a bottom surface of the top electrode.

14. The integrated chip of claim 9, wherein the bottom electrode has a center region and a peripheral region laterally wrapped around the center region, wherein the piezoelectric structure directly overlies the center region, wherein the dielectric layer directly contacts a top surface of the bottom electrode in the peripheral region.

15. The integrated chip of claim 9, wherein the dielectric layer comprises a horizontal thickness defined along a top surface of the top electrode and a vertical thickness defined along a sidewall of the top electrode, wherein the horizontal thickness is greater than the vertical thickness.

16. A method for forming an integrated chip, comprising:
forming a bottom electrode over a substrate;
forming a piezoelectric structure over the bottom electrode, wherein the piezoelectric structure has a first upper surface and a second upper surface vertically below a top surface of the piezoelectric structure and directly overlying the bottom electrode;
forming a top electrode over the top surface of the piezoelectric structure, wherein an outer perimeter of the top electrode is spaced between the first and second upper surfaces; and
forming a passivation layer over the piezoelectric structure and the top electrode, wherein the passivation layer has a horizontal thickness contacting a middle region of the top electrode and defined between a top surface of the top electrode and a top surface of the passivation layer, wherein the passivation layer has a vertical thickness defined between a sidewall of the top electrode and an adjacent sidewall of the passivation layer, wherein the vertical thickness is less than the horizontal thickness, and wherein at least a portion of the vertical thickness directly overlies the first upper surface.

17. The method of claim 16, wherein the passivation layer comprises an outer segment directly overlying an outer region of the first upper surface of the piezoelectric structure, wherein a height of the outer segment is greater than the vertical thickness.

18. The method of claim 16, further comprising:
forming a conductive contact over the top electrode and the piezoelectric structure such that the conductive contact comprises a slanted segment directly overlying the first upper surface of the piezoelectric structure.

19. The method of claim 16, wherein forming the bottom electrode includes performing a patterning process on the bottom electrode according to a masking layer overlying the top electrode, wherein a midpoint of the masking layer is laterally offset from a midpoint of the top electrode by a non-zero distance.

20. The method of claim 16, wherein the piezoelectric structure is a single continuous layer.

* * * * *